(12) United States Patent
Splithof et al.

(10) Patent No.: US 7,948,320 B2
(45) Date of Patent: May 24, 2011

(54) SYNCHRONIZED TEMPERATURE PROTECTION FOR CLASS-AB AMPLIFIERS

(75) Inventors: Mike Splithof, Silvolde (NL); Paul Bruin, Nijmegen (NL)

(73) Assignee: NXP B.V., Eindhoven (NL)

( * ) Notice: Subject to any disclaimer, the term of this patent is extended or adjusted under 35 U.S.C. 154(b) by 971 days.

(21) Appl. No.: 11/814,792

(22) PCT Filed: Jan. 17, 2006

(86) PCT No.: PCT/IB2006/050169
§ 371 (c)(1),
(2), (4) Date: Jul. 25, 2007

(87) PCT Pub. No.: WO2006/079941
PCT Pub. Date: Aug. 3, 2006

(65) Prior Publication Data
US 2010/0039176 A1  Feb. 18, 2010

(30) Foreign Application Priority Data
Jan. 25, 2005  (EP) ..................... 05100443

(51) Int. Cl.
H03F 3/04  (2006.01)
(52) U.S. Cl. .............. 330/296; 330/289; 330/285
(58) Field of Classification Search .............. 330/289, 330/285, 296, 256, 266, 272
See application file for complete search history.

(56) References Cited

U.S. PATENT DOCUMENTS

| 5,159,520 A | 10/1992 | Toyooka et al. |
| 5,994,958 A | 11/1999 | Van Leeuwen |
| 6,559,722 B1 * | 5/2003 | Lopez et al. ............ 330/296 |

FOREIGN PATENT DOCUMENTS

| GB | 2316819 A | 3/1998 |
| JP | 2000134074 A | 5/2000 |

* cited by examiner

Primary Examiner — Hieu P Nguyen

(57) ABSTRACT

The present invention relates to a synchronization circuit for an integrated amplifier provided with a bandwidth control in accordance to a bandwidth control signal, wherein said synchronization circuit comprises a control terminal for a control signal and rank selector means connected to an internal control signal and being configured to emboss said internal control signal to said control terminal, if said internal control signal has a higher rank in accordance to a predetermined ranking criteria in comparison to said control signal. Further, the present invention relates to a respective synchronization method for continuously communicating and synchronizing of a common control signal for multiple circuits. One preferred application of the invention is in temperature protection by a synchronized bandwidth control for multiple class-AB amplifiers by means of only one additional terminal pin per amplifier. In such multi-channel amplifier configuration, the hottest amplifier dictates the amount of bandwidth reduction. By the invention the individual amplifiers can communicate about their individual temperatures, by which the temperature of the actual hottest amplifier and the respective required bandwidth reduction is determined and provided to each individual amplifier for a synchronized bandwidth reduction. Thus, in three channel RGB-amplifiers the signal integrity is advantageously maintained.

15 Claims, 4 Drawing Sheets

SYNCHRONIZED TEMPERATURE PROTECTION FOR CLASS-AB AMPLIFIERS

The present invention relates to a synchronization circuit for an integrated amplifier according to claim 1, a synchronization method according to claim 10, and an electronic device according to claim 14.

Amplifiers, in particular class-AB amplifiers, have the ability to deliver signal output current, which exceeds the current that is flowing in the circuit during quiescence. Additionally, with a capacitive load, the level of signal output current increases with signal frequency. Accordingly, power dissipation in the output transistors increases with signal frequency, which, in turn, gives rise to temperature increase of the amplifier due to the self-heating effect of power dissipation. That is, power dissipation is the primary source that determines the junction temperature of semiconductor elements. A further important source is the temperature of the environment where the amplifier is operated. To prevent excessive junction temperatures in high-temperature environments, a temperature protection can be added to the amplifier circuit, which is designated to decrease the power dissipation of the amplifier before the junction temperature becomes too high.

Applications exist, in which multiple amplifiers are used in parallel channels, each amplifier having its own temperature. For example, in a cathode ray tube (CRT) display three separate video output amplifiers directly drive the individual, i.e. red, green, and blue, cathodes of the CRT. For maintenance of signal integrity, in particular color balance, it is desired to have the temperature protection act on all parallel channels simultaneously to the same extend.

A first approach of a known protection scheme in amplifiers, in particular with capacitive load, is related to the fact that the power dissipation increases with signal frequency. Therefore, a way to decrease power dissipation is to decrease the bandwidth of the amplifier when temperature rises above a certain level. This can be done in many ways. For example, in an amplifier with overall feedback, in which the closed loop bandwidth has a linear relation to the open loop gain, by reducing the open loop gain, the bandwidth is reduced accordingly.

U.S. Pat. No. 5,994,958 describes a method for controlling the power dissipation in a video output amplifier by analyzing the supply current of the amplifier and generating a control signal for a bandwidth-reducing circuit which limits the bandwidth of the input signals before arriving at the input of the respective amplifier. Instead of actually sensing the temperature, the supply current is used as indication for the die temperature, which is less accurate. Further, for synchronization of the bandwidth control signal a weighted sum of the determined temperatures of the individual amplifiers is used. However, this solution suffers the drawback that the temperature protection will be activated at a lower temperature when more amplifiers have a high temperature even if the individual temperature of each amplifier would not be a problem, at all.

It is an object of the invention to provide a synchronization circuit, which allows synchronizing a common control signal of multiple circuits at the cost of only one terminal pin. In particular, it is an object of the invention to provide a synchronization circuit for an integrated amplifier circuit with temperature protection by bandwidth reduction, which is synchronized among multiple amplifiers at the cost of only one control pin.

It is another objective of the present invention to provide a synchronization method for continuously communicating and synchronizing of a common control signal for multiple circuits. In particular, it is another objective of the present invention to provide a synchronization method for synchronization of a common bandwidth control signal for synchronized bandwidth reduction in multiple amplifiers for the purpose of temperature protection.

All or particular objectives of the invention are solved by a circuit as follows: A synchronization circuit for an integrated amplifier provided with a bandwidth control in accordance to a bandwidth control signal, said synchronization circuit comprises a control terminal for a control signal, and rank selector means connected to an internal control signal and being configured to emboss said internal control signal to said control terminal, if said internal control signal has a higher rank in accordance to a predetermined ranking criteria in comparison to said control signal.

All or particular objectives of the invention are solved by a method as follows: A synchronization method for continuously communicating and synchronizing of a common control signal for multiple circuits, said method comprises the steps of generating a respective internal control signal in each of said circuits, of comparing continuously within each of said circuits said respective internal control signal to said actual common control signal, and of adjusting said actual common control signal to said respective internal control signal, if an actual level of said respective internal control signal is higher than an actual level of said common control signal such that said an actual common control signal has a maximum level of said respective internal control signals. Said adjusting of said method can be modified in that if an actual level of said respective internal control signal is lower than an actual level of said common control signal such that said actual common control signal has a minimum value of said respective internal control signals.

The essential idea of the invention is to synchronize a common control signal, e.g. a common bandwidth control signal, in multiple circuits, e.g. multiple individual integrated amplifiers, at the cost of only one control terminal pin or lead at which said common control signal is present. Preferably, said internal control signal corresponds to an actual temperature of said amplifier circuit such that, for instance, the bandwidth of said amplifier can advantageously be adjusted for the purpose of temperature protection. Moreover, said control terminal is advantageously connectable to one or more respective control terminals of further synchronization circuits of the invention. Thus, for example, said synchronized bandwidth reduction for temperature protection is controlled by the actual hottest amplifier. Alternatively, said control terminal can be connected to an external control signal designated for setting an external control signal level.

According to a first embodiment of the invention, said ranking criteria is a minimum criteria and said rank selector means is configured for embossing said internal control signal to said control terminal, if an actual level of said bandwidth control signal is higher than an actual level of said internal control signal. Said rank selector means can be implemented as an amplifier, preferable a voltage amplifier, with unity feedback and limited current sourcing capability at its output.

According to a second embodiment, said rank criteria is a maximum criteria and said rank selector means are configured for embossing said internal control signal to said control terminal, if an actual level of said control signal is lower than an actual level of said internal control signal. Said rank selector means can be implemented as an amplifier, preferable a voltage amplifier, with unity feedback and limited current sinking capability.

In other words, according to the invention said rank selector means are configured such that according to the implemented ranking criteria said rank selector means can only increase, i.e. in case said maximum criteria is used, or lower, i.e. in case said minimum criteria is used, respectively, an actual level of said control signal present at said control terminal but not in to the other respective direction. By this synchronization circuit configuration, it is possible to use only one terminal, which corresponds to a lead or pin in a packed integrated circuit, for synchronization of a control signal in multiple circuits at the cost of only one control pin at which said common control signal is present. Advantageously, said control pin can also be used for input of an external control signal. Moreover, when no external control signal is used then said amplifier circuit according to the invention controls its bandwidth by its own internal control signal.

As to said method, there may be further the step of using said synchronized common control signal within each of said circuits for a synchronized adjustment of a characteristic of each of said circuits. In one embodiment said circuits are amplifier circuits, said characteristic is a respective bandwidth of said respective amplifier circuits, and said control signal is used for a synchronized adjustment of said respective bandwidth of said respective amplifier circuits.

Said amplifier circuit according to the invention can preferably be used in an electronic device comprising multiple amplifier circuits each with a synchronization circuit according to the invention which face different temperatures due to different individual signal frequencies. Advantageously, said synchronization circuits can be connected together at said control terminal, thus said amplifier circuits are provided with a temperature protection by a synchronized bandwidth reduction which is preferably controlled by a method according to the invention.

In a most preferred application of the inventive amplifier circuits, such an electronic device is a cathode ray tube display and said multiple amplifier circuits are respective separate video amplifiers for driving individual cathodes of said cathode ray tube.

As a major advantage of the invention a synchronized control of a certain characteristic of a circuit, respectively present in parallel channels can be achieved. Preferably, such circuits are parallel-arranged circuits of the same type. In the preferred embodiment, a multi-channel amplifier configuration, the hottest amplifier is able dictate the amount of bandwidth reduction in order to protect adequately against overheating. By the invention, individual amplifiers can communicate about their individual temperatures. By use of a rank selector means with maximum criteria or minimum criteria, which depends on the actual implementation, subsequently the temperature of the hottest amplifier is determined, which corresponds to the required amount of bandwidth control. By the invention, this information is provided to each individual amplifier. All communication is advantageously done with only one extra pin per amplifier circuit, which is of particular interest when dealing with integrated amplifiers, because pin count is of particular interest when dealing with integrated amplifiers.

The invention will be more completely understood in consideration of the following detailed description of various embodiments of the invention in connection with the accompanying drawings, in which.

Figure 1:
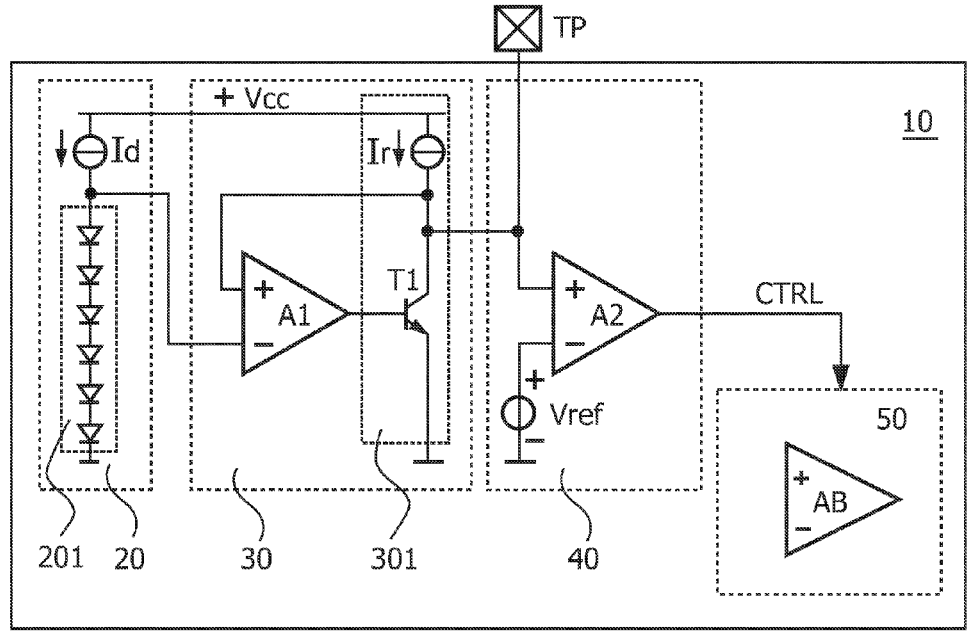
FIG. 1 illustrates an amplifier circuit according to the invention.

While the invention is amendable to various modifications and alternative forms, specifics thereof will be shown by way of example in the drawings and will be described in detail. However, it should be understood that the intention is not to limit the invention to the particular embodiments described. In particular, whilst the invention is described by reference to an amplifier circuit in which the synchronization circuit of the invention is implemented, it goes without saying that the synchronization circuit can be used in several other circuits providing the same advantages. Therefore, the intention is to cover all modifications, equivalents, and alternatives falling within the scope of the invention as defined by the appended claims.

Now reference is made to FIG. 1, which illustrates an integrated amplifier circuit 10, in which a synchronization circuit according to the invention is implemented. In FIG. 1, an internal control signal is generated by generating means 20, which comprise a diode stack 201, which is a series connection of several diodes, connected to ground as reference potential and supplied by a constant current of a current source Id. The diode stack 201 comprises n diode junctions, wherein n is 6 in this case. The voltage over the diode stack 201 corresponds to the actual absolute temperature of the integrated amplifier circuit 10 and will be used as internal control signal according to the invention. It is noted, that it may be also possible to use other physical references for generating of a respective control signal instead of the temperature.

Typically, one individual diode voltage has a constant part and a part that decreases by about −2.2 mV per Kelvin. When referring one side of the diode stack to the positive supply +Vcc, the bottom side of the diode stack will have a positive temperature coefficient, i.e. +2.2×n [mV/K]. When referring to ground, as in FIG. 1, the voltage at the top of the diode stack 201 will have a negative temperature coefficient, i.e. −2.2×n [mV/K]. It is to be noted that there are several other ways for generating such an internal control signal corresponding to the absolute temperature. For instance, instead of the diode stack 201, a base-emitter-voltage ($V_{BE}$)-multiplier may be used. In that case, n may also be a non-integer value. Moreover, instead of a diode element also a bipolar transistor operated in diode configuration may be used.

The internal control signal is input to rank selector means 30, which is realized by a voltage follower constituted of an amplifier A1 with unity feedback and with limited current sourcing capability in the output stage 301. This limited current sourcing capability enables for the intended operation as rank selector means 30. In detail, the current source capability of the voltage follower is limited to the current Ir provided by the current source Ir. The output voltage of the voltage follower is the collector emitter voltage of the transistor T1 in the output stage 301, which is controlled at the base terminal by the output of the amplifier A1. The output voltage of the rank selector means 30 is connected to a control terminal TP, which in this application is a temperature protection pin.

Then the signal level, i.e. the voltage, at the control terminal TP is compared by comparing means 40 to a reference voltage Vref. In FIG. 1, the comparing means 40 is a voltage amplifier A2 and the reference voltage Vref is provided by a bandgap circuit (not shown). By comparing the control signal from the control terminal TP to the reference voltage Vref, the constant part of the diode voltage is subtracted. The output of the comparing means 40, i.e. the differential part of the control signal, is used as a measure for a needed bandwidth control. It is noted that the actual bandwidth control node is kept internally and only the control terminal TP is shared with other synchronization circuits of other integrated amplifiers. Thus, the advantage of a reduced pin count is achieved.

Figure 2:
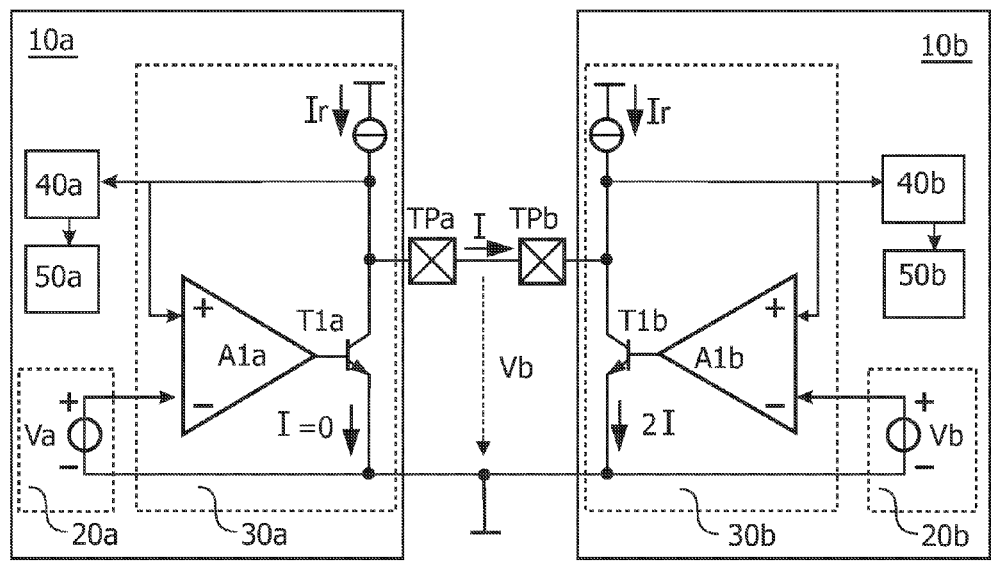
FIG. 2 shows two amplifiers of the invention interconnected at a common control terminal.

The operation of the synchronization of the control signal, i.e. a bandwidth control signal for at least two amplifiers, will be explained with reference to FIG. 2. First, it is assumed that the integrated amplifier 10*b* has a higher temperature as the integrated amplifier 10*a*. Thus, for the internal bandwidth control signals Va, Vb, follows that Va is higher than Vb. Therefore, the voltage amplifier A1*a* with output stage transistor T1*a* at the left hand side will try to increase the voltage at its control terminal TPa, which is interconnected to the control terminal TPb of the second integrated amplifier 10*b*.

Due to the feedback loop the voltage amplifier A1*a* decreases the current through its output transistor T1*a*. This process stops when the current in the output transistor T1*a* becomes zero (I=0), i.e. the whole current of both current sources Ir flows through transistor T1*b*. At this point, the feedback loop of voltage amplifier A1*a* is interrupted. From this moment, the voltage amplifier A1*b* at the right hand side holds the voltage at the connected control terminals TPa and TPb equal to Vb. That is, the minimum of the internal control signals Va and Vb is present at the control terminals TPa, TPb. This is exactly what is needed because in this configuration the minimum voltage Vb is a direct measure for the hottest integrated amplifier 10*b* as assumed above. This also explains why it is essential to have voltage followers with limited current sourcing capability to make the inventive rank selector means 30*a*, 30*b*, which synchronize the common control signal according to a minimum criteria.

Figure 3:
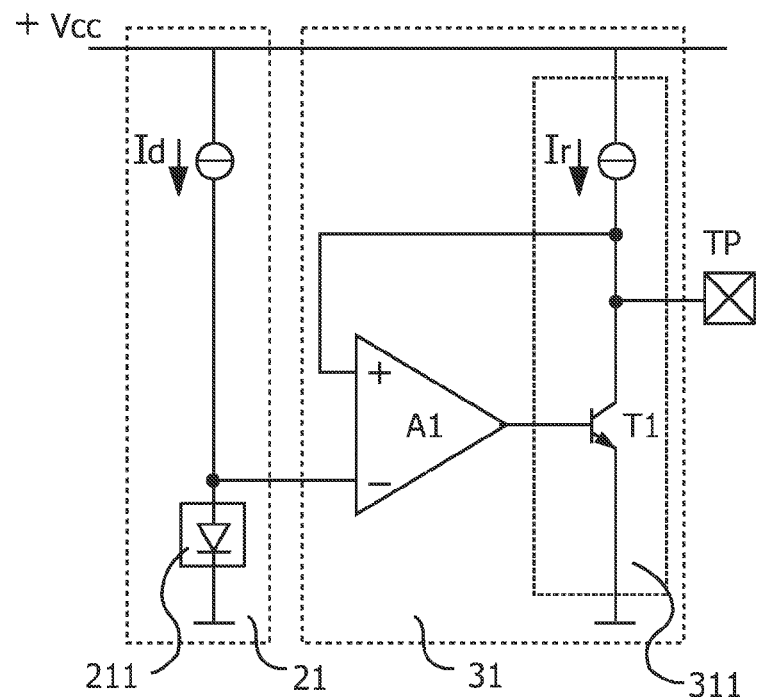
FIG. 3 shows an example for a maximum rank selector.
Figure 4:
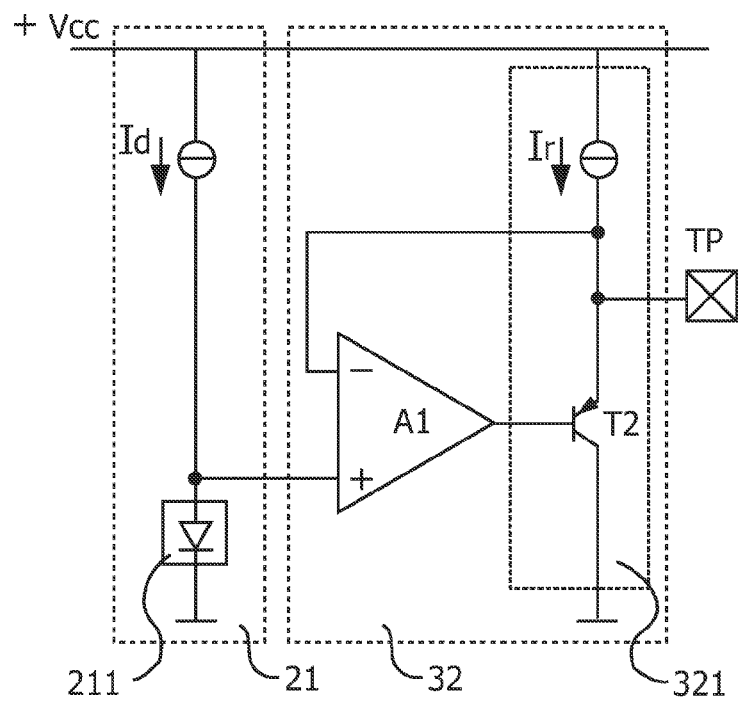
FIG. 4 shows an alternative implementation for the maximum rank selector.
Figure 5:
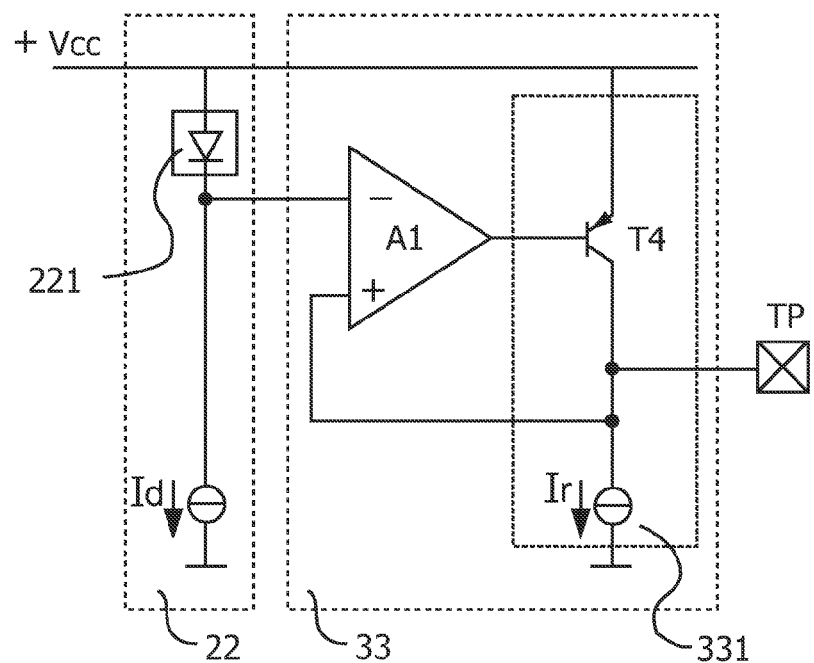
FIG. 5 shows an example for a minimum rank selector.
Figure 6:
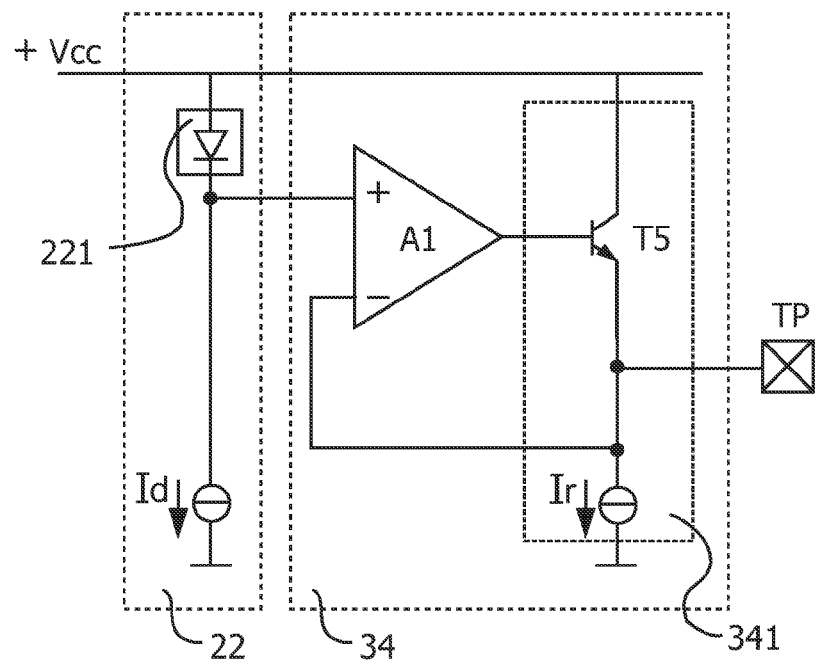
FIG. 6 shows an alternative implementation for the minimum rank selector.

FIGS. 3 to 6 show different implementations of the rank selector means, which are configured according to the minimum criteria in FIGS. 3 and 4 and which are configured according to the maximum criteria in FIGS. 5 and 6. As mentioned before, it is essential to have a limited current sourcing capability to make a minimum rank selector means, whilst for a maximum rank selector means a limited current sinking capability is required. Since FIG. 3 shows the generating means 20 and minimum rank selector means 30 of FIG. 1, for sake of brevity FIG. 3 will not described in further detail.

In FIG. 4 as difference to FIG. 3 a pnp-bipolar transistor T2 is used in the output stage 321 of the rank selector means 32. Therefore, the internal control signal provided by the generating means 21 is connected to the positive input terminal of the amplifier A1. The signal of the control terminal TP is feed back to the negative input terminal of the amplifier A1. Thus, again the amplifier A1 is used as a voltage follower and the current sourcing capability is limited to the current of the current source Ir.

FIGS. 5 and 6, respectively, are implementations for maximum rank selector means 33 and 34, respectively. In the generating means 22 a diode stack 221 is used, which has the positive power supply +Vcc as reference, i.e. which is referred to the positive supply +Vcc. Accordingly, a voltage follower with limited current sinking capability is required, i.e. rank selector means 33, 34 with maximum criteria are needed. Then the level of the bandwidth control signal at the respective control terminal TP corresponds to the maximum internal control signal among all amplifiers. It is further noted that at the amplifier A2 (FIG. 1) for comparing the control signal voltage at the control terminal TP to the reference voltage Vref has then also reversed inputs.

Since in the generating means 22 the respective diode stack 221 is connected to the positive supply voltage +Vcc, the respective internal control signal that corresponds to the absolute temperature of the whole circuit has now a positive temperature coefficient. Thus, as higher the internal control signal level as higher is the actual temperature of the whole amplifier circuit. Further, the respective voltage follower constituted by the amplifier A1 has in its output stage 331 or 341, respectively, a bipolar transistor T4 or T5, respectively, which is connected at the respective emitter (T4) or collector (T5) to the positive supply voltage +Vcc and by a respective current source Ir to the ground. Thus, the output stages 331, 341 have the needed limited current sinking capability, which provides for the intended maximum rank selector function.

It goes without saying, that for the bipolar transistors T1, T2, T4, and T5 of the ranking selector means 31, 32, 33, and 34 in the FIGS. 3 to 6 also field effect transistors may be used instead.

Figure 7:
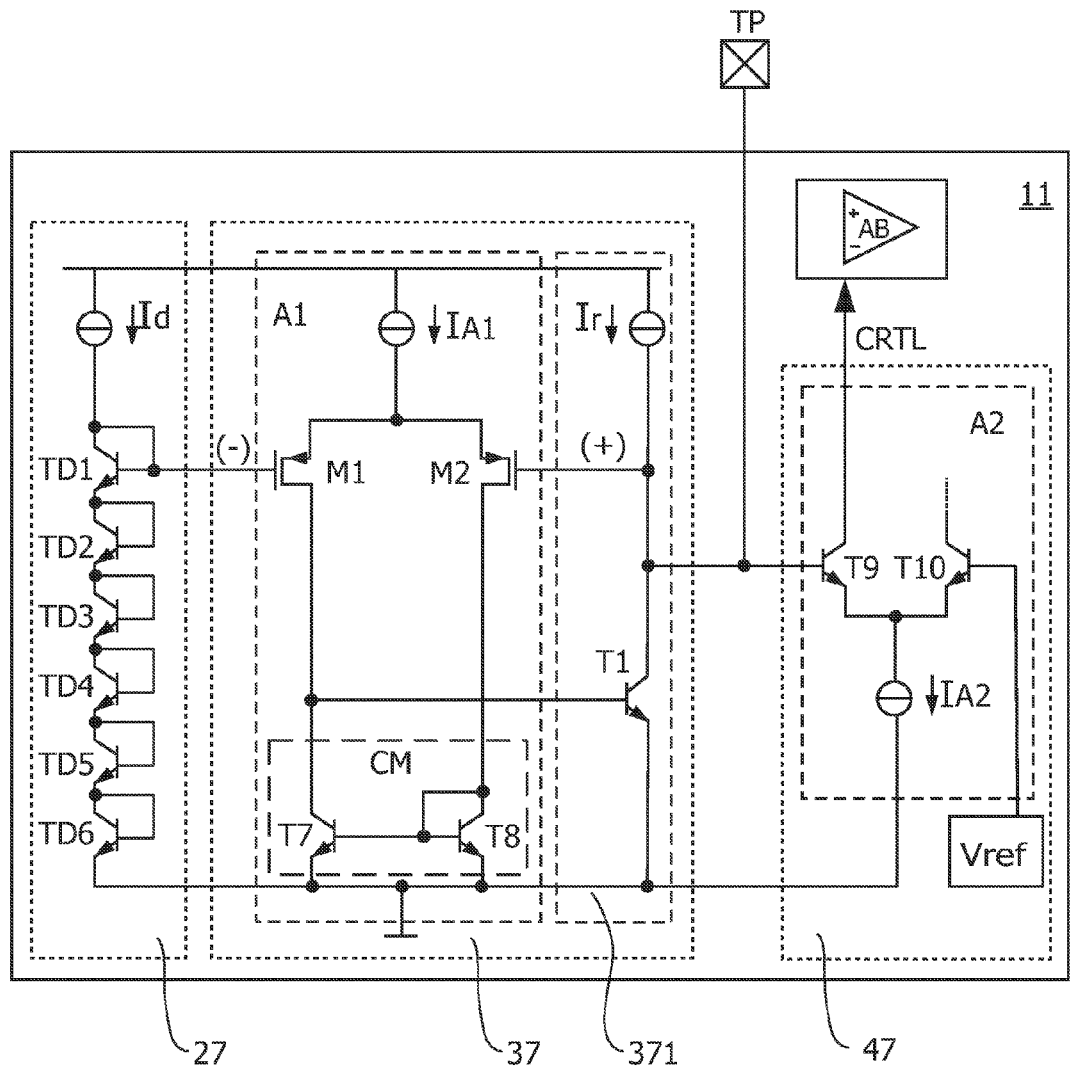
FIG. 7 shows a schematic of a preferred embodiment of the present invention.

FIG. 7 shows a preferred implementation of the temperature protection used in an amplifier 11. There are generating means 27 for generating of the internal control signal corresponding to the actual temperature of the amplifier 11. In the preferred embodiment for the measurement of the actual temperature a stack of six bipolar transistors TD1 to TD6 in diode configuration are used, which are supplied with a constant current by current source Id.

The internal control signal is connected to the amplifier A1 via the negative input terminal. The amplifier A1 is of the differential amplifier type and constituted of a base current mirror CM of two bipolar transistors T7, T8 in known current mirror configuration, the negative input terminal (−) is formed by the gate of a first field effect transistor M1 and the positive terminal is formed by the gate of a second field effect transistor M2. Both field effect transistors M1 and M2 have a common source terminal at which the differential amplifier is supplied by a current source IA1 with a constant current. The field effect transistor M1 is interconnected with the collector of the bipolar transistor T7 of the current mirror CM and the interconnection node is connected to the base of the output stage bipolar transistor T1, which is connected with its collector to the control terminal TP, to the positive input (+) of the differential amplifier A1, as well as to the current source Ir. Again, the current source Ir in the output stage 371 provides for the required limited current sourcing capability of the rank selector means 37.

The control signal present at the control terminal TP is connected to the comparing means 47, which are constituted of a differential amplifier A2 that is made of a current source IA2 and two bipolar transistors T9, T10. By means of the amplifier A2, the constant part of the control signal is subtracted. For that purpose, an applicable reference voltage Vref, which is preferably a bandgap voltage, is used. Thus, the resulting bandwidth control signal CRTL corresponds solely to the differential part of the control signal present at the control terminal TP.

The bandwidth control signal CRTL is connected to a class-AB amplifier part AB of the integrated amplifier 11. The class-AB amplifier part AB is configured such that the bandwidth is controllable in accordance to the bandwidth control signal CRTL. As to the operation of the circuit reference is made to the description of FIG. 1, which basically applies also to FIG. 7, accordingly.

By the present invention has been disclosed a synchronization circuit for an integrated amplifier provided with a bandwidth control in accordance to a bandwidth control signal, wherein said synchronization circuit comprises a control terminal for a control signal and rank selector means connected to an internal control signal and being configured to emboss said internal control signal to said control terminal, if said internal control signal has a higher rank in accordance to a predetermined ranking criteria in comparison to said control signal. Further, the present invention provides with a respective synchronization method for continuously communicating and synchronizing of a common control signal for multiple circuits.

One preferred application of the invention is as a temperature protection circuit for a synchronized bandwidth control in multiple class-AB amplifiers by means of only one additional terminal pin per amplifier. In such multi-channel amplifier configuration, the hottest amplifier can dictate the amount of bandwidth reduction in all of the multiple amplifiers. In other words, by the invention the individual amplifiers can communicate about their individual temperatures, by which the temperature of the actual hottest amplifier and the respective required bandwidth reduction is determined and provided to each individual amplifier for a synchronized bandwidth reduction. For instance, in a three-channel RGB-amplifier configuration the signal integrity can be advantageously maintained. In particular, the principle of the invention can be applied in all kinds of class-AB amplifiers with capacitive load and which suffer from self-heating.

Finally but yet importantly, it is noted that the term "comprising" when used in the specification including the claims is intended to specify the presence of stated features, means, steps or components, but does not exclude the presence or addition of one or more other features, means, steps, components or groups thereof. Further, the word "a" or "an" preceding an element in a claim does not exclude the presence of a plurality of such elements. Moreover, any reference sign does not limit the scope of the claims. Furthermore, it is to be noted that "coupled" is to be understood that there is a current path between those elements that are coupled; i.e. "coupled" does not mean that those elements are directly connected.

The invention claimed is:

1. Synchronization circuit for an integrated amplifier provided with a bandwidth control in accordance to a bandwidth control signal, said synchronization circuit comprising: a control terminal for a control signal; and rank selector means connected to an internal control signal and being configured to emboss said internal control signal to said control terminal, if said internal control signal has a higher rank in accordance to a predetermined ranking criteria in comparison to said control signal.

2. Circuit according to claim 1, wherein said ranking criteria is a minimum criteria and said rank selector means is configured for embossing said internal control signal to said control terminal, if an actual level of said control signal is higher than an actual level of said internal control signal.

3. Circuit according to one of the claim 2, wherein said rank selector means is an amplifier with unity feedback and limited current sourcing capability.

4. Circuit according to claim 1, wherein said rank criteria is a maximum criteria and said rank selector means are configured for embossing said internal control signal to said control terminal, if an actual level of said control signal is lower than an actual level of said internal control signal.

5. Circuit according to one of the claim 4, wherein said rank selector means is an amplifier with unity feedback and limited current sinking capability.

6. Circuit according to claim 1, wherein said synchronization circuit is implemented in said integrated amplifier circuit, wherein said integrated amplifier circuit is a class-AB amplifier.

7. Circuit according to claim 6, wherein said internal control signal corresponds to an actual temperature of said integrated amplifier circuit and said bandwidth is adjusted in accordance to said control signal for temperature protection.

8. Circuit according to claim 1, wherein said control terminal is connectable to one or more respective control terminals of at least one further synchronization circuit.

9. Circuit according to claim 1, wherein said control terminal is connectable to an external control signal designated for setting an external control signal level.

10. Electronic device comprising multiple amplifier circuits with a synchronization circuit according to claim 1, wherein said synchronization circuits are connected together at said control terminal.

11. Electronic device according to claim 10, wherein said electronic device is a cathode ray tube display and said multiple amplifier circuits are respective separate video amplifiers for driving individual cathodes of said cathode ray tube.

12. Synchronization method for continuously communicating and synchronizing of a common control signal for multiple circuits, said method comprising the steps:—generating a respective internal control signal in each of said circuits; comparing continuously within each of said circuits said respective internal control signal to said actual common control signal; and adjusting said actual common control signal to said respective internal control signal, if an actual level of said respective internal control signal is higher than an actual level of said common control signal such that said an actual common control signal has a maximum level of said respective internal control signals.

13. Method according to claim 12, said adjusting modified in that if an actual level of said respective internal control signal is lower than an actual level of said common control signal such that said actual common control signal has a minimum value of said respective internal control signals.

14. Method according to claim 12, wherein said method comprises further the step of using said synchronized common control signal within each of said circuits for a synchronized adjustment of a characteristic of each of said circuits.

15. Method according to claim 12, wherein said circuits are amplifier circuits, said characteristic is a respective bandwidth of said respective amplifier circuits, and said control signal is used for a synchronized adjustment of said respective bandwidth of said respective amplifier circuits.

* * * * *